(12) United States Patent
Wojnowski et al.

(10) Patent No.: US 11,387,533 B2
(45) Date of Patent: Jul. 12, 2022

(54) SEMICONDUCTOR PACKAGE WITH PLASTIC WAVEGUIDE

(71) Applicant: Infineon Technologies AG, Neubiberg (DE)

(72) Inventors: Maciej Wojnowski, Munich (DE); Dirk Hammerschmidt, Finkerstein (AT); Walter Hartner, Bad Abbach-Peissing (DE); Johannes Lodermeyer, Kinding (DE); Chiara Mariotti, Villach (AT); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/032,589

(22) Filed: Jul. 11, 2018

(65) Prior Publication Data
US 2020/0021002 A1    Jan. 16, 2020

(51) Int. Cl.
| | | |
|---|---|---|
| *G02B 6/12* | (2006.01) | |
| *H01P 3/16* | (2006.01) | |
| *H01Q 3/44* | (2006.01) | |
| *H01L 23/66* | (2006.01) | |

(52) U.S. Cl.
CPC ............. *H01P 3/16* (2013.01); *H01L 23/66* (2013.01); *H01Q 3/44* (2013.01); *H01L 2223/6677* (2013.01)

(58) Field of Classification Search
CPC .. H01P 3/16; H01Q 3/44; H01L 23/66; H01L 2223/6677
USPC ................... 385/14–18, 35, 40, 49
See application file for complete search history.

(56) References Cited

U.S. PATENT DOCUMENTS

| | | | | |
|---|---|---|---|---|
| 5,581,267 | A | * | 12/1996 | Matsui ................... H01Q 19/10 343/753 |
| 9,483,725 | B2 | * | 11/2016 | Padilla Alcaide .......................... G06K 19/07758 |
| 9,490,518 | B1 | | 11/2016 | Herbsommer et al. |
| 2011/0121258 | A1 | * | 5/2011 | Hanein ................... H01L 27/28 257/9 |
| 2016/0293557 | A1 | | 10/2016 | Topak et al. |
| 2016/0308266 | A1 | * | 10/2016 | Hammerschmidt ..... H01Q 1/50 |

FOREIGN PATENT DOCUMENTS

| | | |
|---|---|---|
| DE | 102015105657 A1 | 10/2016 |
| WO | 2014153393 A2 | 9/2014 |

OTHER PUBLICATIONS

May 3, 2022—(DE) Office Action—App 102019118691.9.

* cited by examiner

*Primary Examiner* — Kaveh C Kianni
*Assistant Examiner* — Hung Q Lam
(74) *Attorney, Agent, or Firm* — Banner & Witcoff Ltd.

(57) ABSTRACT

A semiconductor device including an Integrated Circuit (IC) package and a plastic waveguide. The IC package includes a semiconductor chip; and an embedded antenna formed within a Redistribution Layer (RDL) coupled to the semiconductor chip, wherein the RDL is configured to transport a Radio Frequency (RF) signal between the semiconductor chip and the embedded antenna. The plastic waveguide is attached to the IC package and configured to transport the RF signal between the embedded antenna and outside of the IC package.

24 Claims, 5 Drawing Sheets

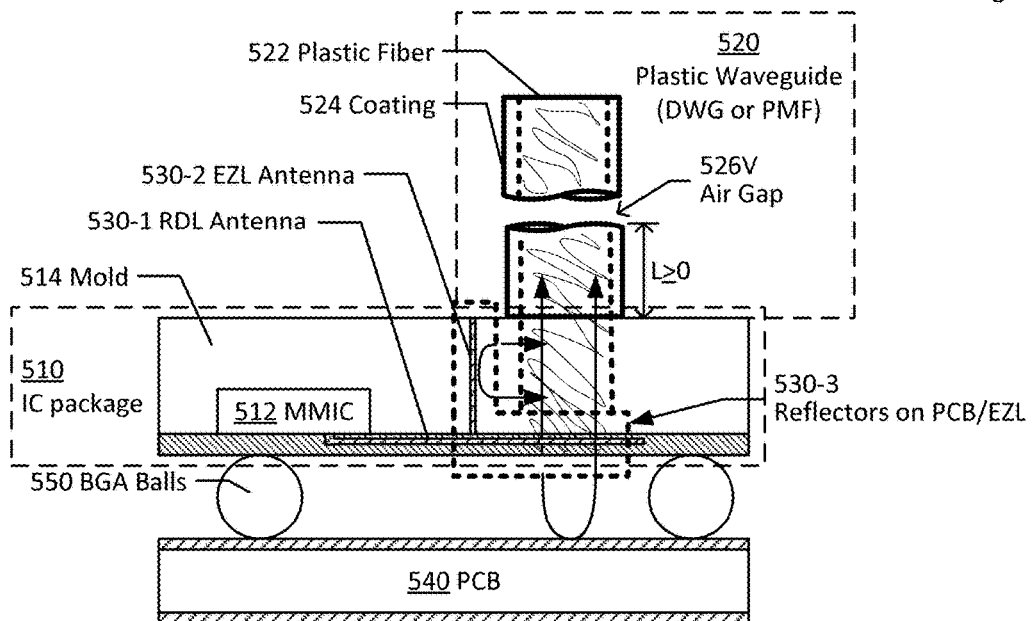
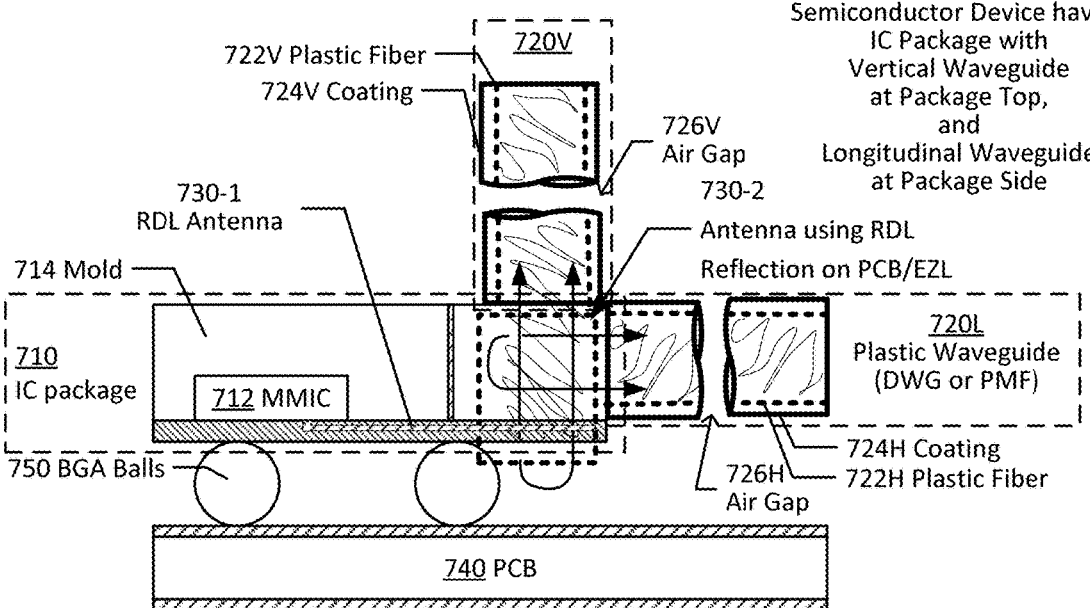

SEMICONDUCTOR PACKAGE WITH PLASTIC WAVEGUIDE

BACKGROUND

Dielectric Wave Guide (DWG) and Polymer Microwave Fiber (PMF) have been proposed to transport Radio Frequency (RF) signals over plastic.

A concept disclosed herein is to replace copper wire transporting signals in the gigabit/second data rate range with plastic waveguide. Typical applications include camera interfaces and Gigabit Automotive Ethernet. With increasing frequency, RF signals inside the plastic waveguide concentrate, isolation distance reduces, and bending losses decay, making this concept attractive for high frequency transmissions.

A critical performance parameter for high frequency components in the higher gigahertz range is output power loss. Therefore, it is desired to transport high frequency signals outside of a chip and/or package with low power loss transitions to drive and control a coupled plastic waveguide.

BRIEF DESCRIPTION OF THE DRAWINGS

FIG. 5 illustrates a semiconductor device having an IC package with vertical waveguide at package top, in accordance with aspects of the disclosure.

FIG. 7 illustrates a semiconductor device having an IC package with vertical waveguide at package top, and longitudinal waveguide at package side, in accordance with aspects of the disclosure.

DETAILED DESCRIPTION

The present disclosure is directed to a high frequency Integrated Circuit (IC) package having attached thereto a plastic waveguide. The IC package includes a semiconductor chip and an embedded antenna configured as a feeding port to the plastic waveguide.

A waveguide is a device that transports Radio Frequency (RF) signals from one location to another. The waveguide acts as a high pass filter in that signal frequencies above a cutoff frequency pass through the waveguide, whereas signal frequencies below are attenuated. Waveguides are often used at microwave frequencies.

Figure 1A:
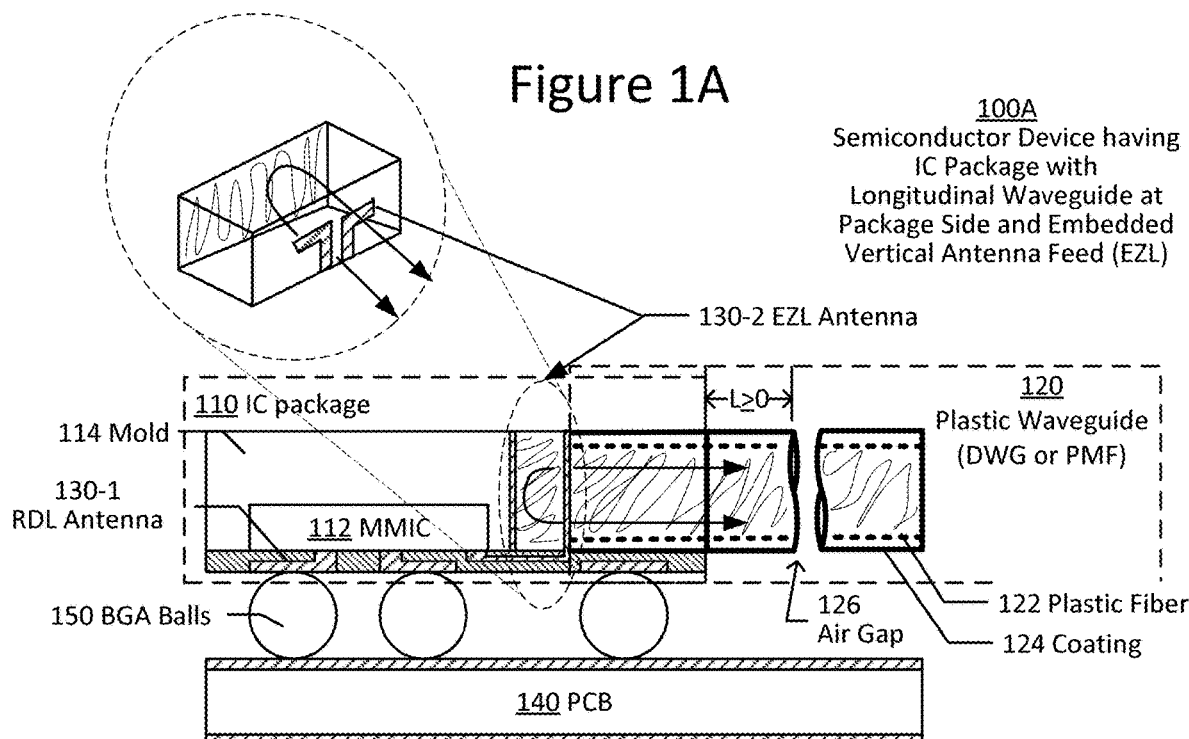
FIGS. 1A and 1B illustrate semiconductor devices having Integrated Circuit (IC) packages with longitudinal waveguide at package side and embedded vertical antenna, in accordance with aspects of the disclosure.

FIG. 1A illustrates a semiconductor device 100A having an Integrated Circuit (IC) package 110 with longitudinal waveguide 120 at package side and embedded vertical antenna 130-2, in accordance with aspects of the disclosure.

The semiconductor device 100A comprises an IC package 110, a plastic waveguide 120, an antenna 130, a Printed Circuit Board (PCB) 140, and Ball Grid Array (BGA) balls 150.

The IC package 110 in this example is a Wafer Level Package (WLP). The IC package 110 in formed on the PCB 140 via an embedded Wafer Level Ball Grid (eWLB) comprising BGA balls 150. The disclosure is not limited to the IC package being a WLP mounted via BGA balls 150. The IC package 110 may be mounted to the PCB 140 using any suitable packaging technology.

The IC package 110 package comprises a semiconductor chip 112 encapsulated in a mold 110 for protection. The semiconductor chip 112 in this example is a Monolithic Microwave Integrated Circuit (MMIC), however, the disclosure is not limited in this respect. The semiconductor chip 112 may be any type of semiconductor chip suitable for the intended purpose.

Further, the semiconductor chip 112 in this example is in a face-down configuration, though the disclosure is not limited in this respect. The semiconductor chips described herein may be in a face-up or face-down orientation. The orientation of the semiconductor chip 112 is determined based on the orientation of the "face" of the chip 112, which is the surface of the chip 112 that comprises the circuitry and BGA balls 150 for electrical connection to the PCB 140. In a face-down orientation, the "face" of the chip 112 point in the direction of the PCB 140, whereas in a face-up orientation, the face points away from the PCB 140.

The antenna 130 comprises a planar duplex antenna using a Redistribution Layer (RDL) 130-1 (hereinafter, "RDL antenna") and embedded vertical antenna (Embedded Z-Line (EZL) 130-2 (hereinafter, "EZL antenna"). The RDL antenna 130-1 is merely a galvanic interconnection through the RDL between the semiconductor chip 112 and the EZL antenna 130-2. The RDL antenna 130-1 and the EZL antenna 130-2 may be comprised of copper, for example.

The RDL antenna 130-1 is coupled to the semiconductor chip 112 and configured to transport RF signals between the semiconductor chip 112 and the EZL antenna 130-2. The EZL antenna 130-2 is configured to transport the RF signals between the RDL antenna 130-1 and the plastic waveguide 120. The EZL antenna 130-2 is formed in a vertical direction, as illustrated in the expanded portion identified by the dotted oval. In this example, the EZL antenna 130-1 comprises a dipole antenna, though the disclosure is not limited in this respect. The dipole antenna may alternatively be any type of antenna as suitable for the intended purpose. The EZL antenna 130-2 radiates in two directions (towards and was from the plastic waveguide 120). An integrated reflector formed on the backside of the EZL antenna 130-2 reflects RF signals traveling in an undesired direction, as illustrated by the U-shaped, two-headed arrow.

The plastic waveguide 120 may be a Dielectric Wave Guide (DWG) or Polymer Microwave Fiber (PMF) having an inner plastic fiber 122 and an outer coating 124. The plastic waveguide 120 is attached longitudinally at the end of the IC package 110, and RF signals transport between the plastic waveguide 120 and the EZL antenna 130-2. The plastic waveguide 120 is configured to transport RF signals between the EZL antenna 130-2 and outside of the IC package 110. The plastic waveguide 120 in this example extends in a longitudinal direction from a side of the IC package 110. The plastic waveguide 120 may have a supporting structure inside or outside of the IC package 110 to guide the plastic waveguide 120. When the plastic waveguide 120 is integrated in the IC package 120, a portion of the plastic waveguide 120 may project from the IC package 120. The length "L" is zero if there is no plastic waveguide 120 projecting, or the length may be greater than zero (L>0) if there is some plastic waveguide 120 projecting. Alternatively, the plastic waveguide 120 need not be integrated into the IC package 110. The plastic waveguide 120 may instead be attached to the EZL antenna 130-2 at the end of the IC package 110. Whether or not the plastic waveguide 120 is integrated into the IC package 110 often depends on which connection is preferable from a mechanical perspective. The chosen connection may also depend on output power loss resulting from the air gap 126, for example.

Figure 1B:
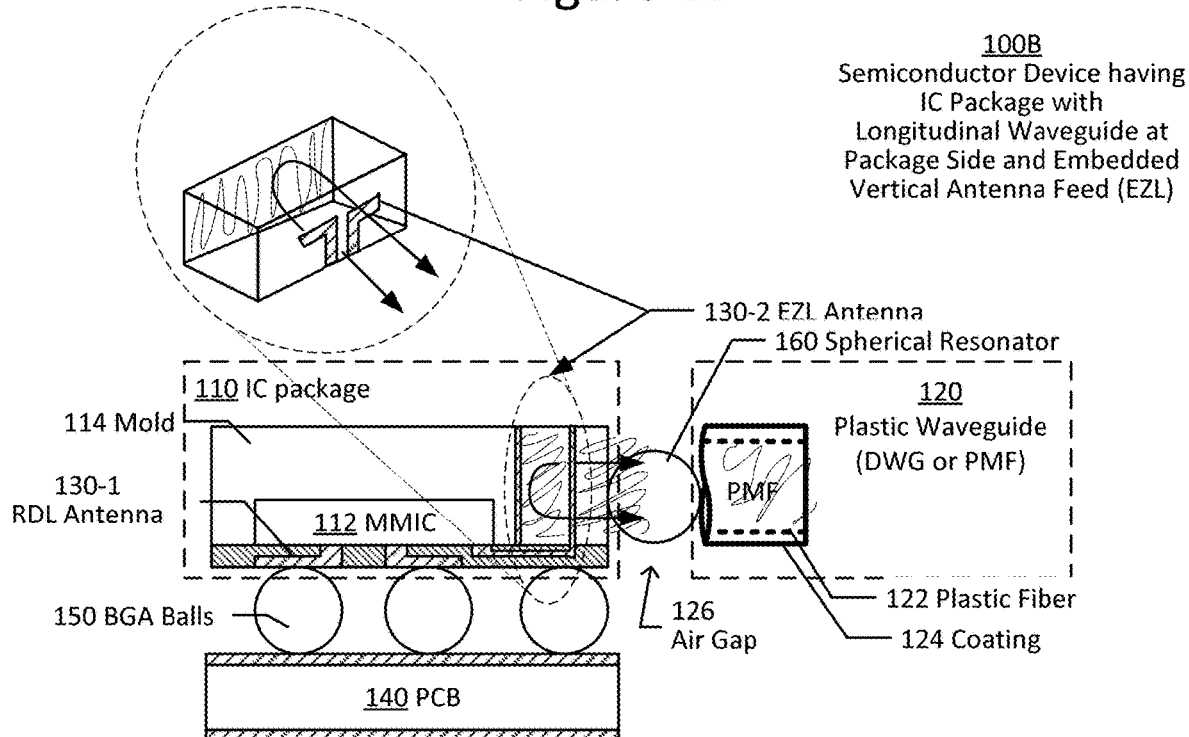

FIG. 1B illustrates a semiconductor device 100B having an IC package 110 with longitudinal waveguide 120 at package side and EZL antenna 130-2, in accordance with aspects of the disclosure.

The semiconductor device 100B of FIG. 1B is similar to the semiconductor device 100A of FIG. 1A, except that the plastic waveguide 120 is not arranged at least partially within the IC package 110. Instead, a spherical resonator 160 is arranged between the IC package 110 and the plastic waveguide 120 to bridge the air gap 126. The spherical resonator 160 may comprise ceramic material or another material having a suitable dielectric constant. The spherical resonator 160 is sized such that it resonates with sufficient radiation performance in a preferred direction and radiation losses other directions.

Figure 2:
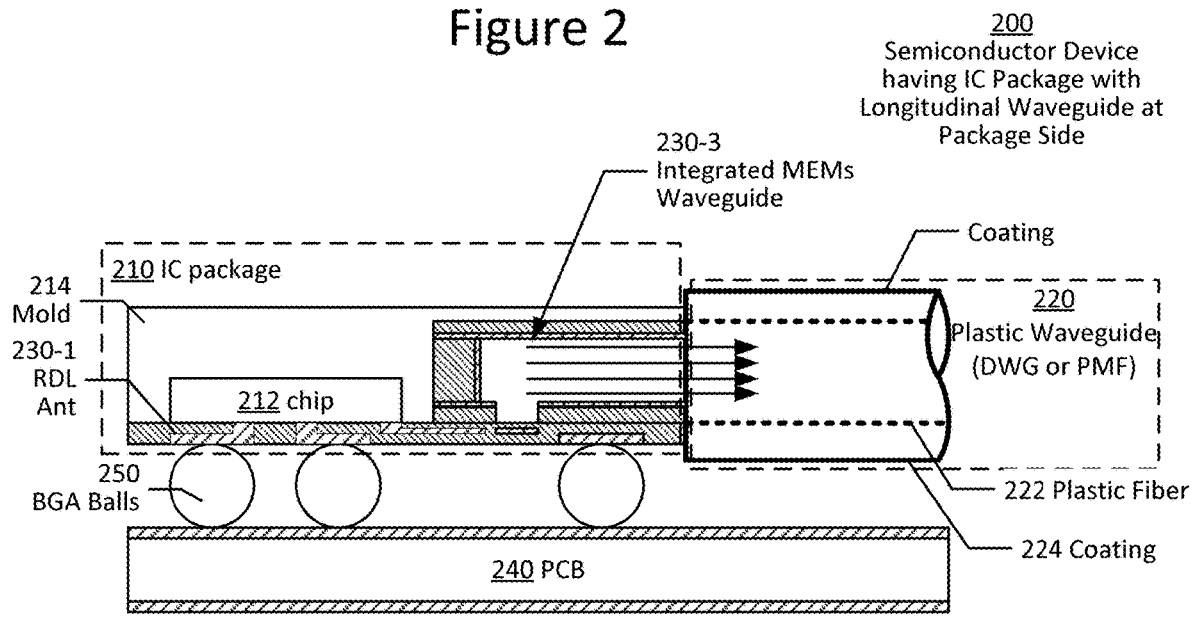
FIG. 2 illustrates a semiconductor device having an IC package with longitudinal waveguide at package side and integrated MicroElectroMechanical System (MEMS) waveguide, in accordance with aspects of the disclosure.

FIG. 2 illustrates a semiconductor device 200 having an IC package 210 with longitudinal waveguide 220 at package side and integrated MicroElectroMechanical Systems (MEMS) waveguide 230-3, in accordance with aspects of the disclosure.

Semiconductor device 200 comprises similar elements as semiconductor devices 100A and 100B of FIGS. 1A and 1B, respectively, but the reference numerals begin with "2" rather than "1". For the sake of brevity, descriptions of these elements are not repeated here.

The antenna 230 of semiconductor device 200 differs from the antenna 130 of semiconductor devices 100A and 100B in that in place of the EZL antenna 130-2 there is a MicroElectroMechanical Systems (MEMS) waveguide 230-2 formed by etching silicon and metallizing some or all of the silicon walls. The Si-MEMS waveguide 230-3 is configured to transport RF signals from the RDL antenna 230-1 to a center of the plastic waveguide 220, as indicated by the arrows, and also in the reverse direction in the case of received RF signals.

The plastic waveguide 220 is attached to a side of the IC package 210, and may have a supporting structure inside or outside of the IC package 210. The plastic waveguide 220 in this example is attached to an outside of the IC package 210. As a supporting structure, the plastic waveguide 220 may be fastened to the IC package 210 by a plastic waveguide fastener (not shown).

Optionally, the Si-MEMS waveguide 230-3 may project out of the mold 214 of the IC package 210 and be inserted into a hollow center of the plastic waveguide 220 providing a mechanical fixture of the plastic fiber 222. This is relevant for a carrier wavelength requiring a plastic waveguide 220 of dimensions that are larger than the thickness of the Si-MEMS waveguide 230-3. For a case in which the plastic fiber 222 has an asymmetrical aspect ratio (e.g., rectangular), such an arrangement can also be used to encode the correct adaptation to the Si-MEMS waveguide 230-3 to receive the intended polarization mode that preferably expands in the plastic fiber 222.

Figure 3:
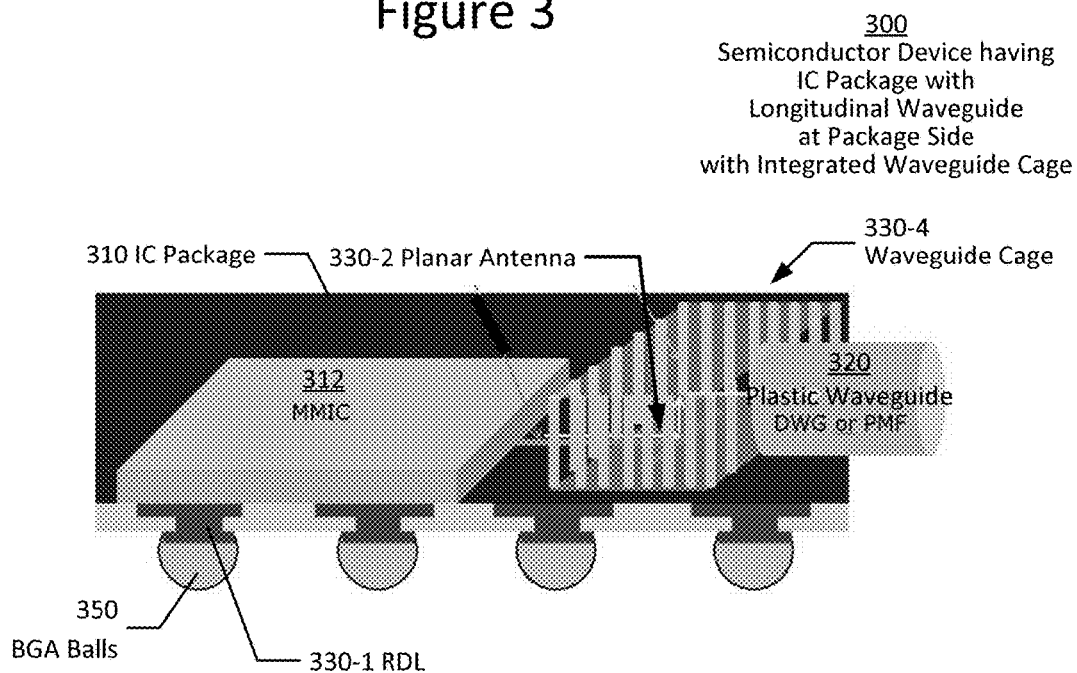
FIG. 3 illustrates a semiconductor device having an IC package with longitudinal waveguide at package side and integrated waveguide cage, in accordance with aspects of the disclosure.

FIG. 3 illustrates a semiconductor device 300 having an IC package 310 with longitudinal waveguide 320 at package side and integrated waveguide cage 330-4, in accordance with aspects of the disclosure.

Semiconductor device 300 comprises similar elements as semiconductor devices 100A, 100B, and 200, but the reference numerals begin with "3". For the sake of brevity, descriptions of these elements are not repeated here.

The semiconductor device 300 differs from that of semiconductor devices 100A and 100B of FIGS. 1A and 1B, respectively, in that in place of the EZL 130-2, there is an embedded planar antenna 330-2 and an embedded waveguide cage 330-4 arranged between the RDL antenna (not shown) and the plastic waveguide 320.

The plastic waveguide 320 is attached to a side of the IC package 310 next to the waveguide cage 330-4. The plastic waveguide 320 may have a supporting structure inside or outside of the IC package 310, as discussed above with respect to the other figures.

The embedded waveguide cage 330-4 comprises densely-spaced metallized vias to form walls. Realizing walls using vias is an alternative to plane metallization. The ceiling and floor of the waveguide cage 330-4 are metallized. The RF signals more or less reflect within the waveguide cage 330-4 until the RF signals transport through the plastic waveguide 320, or in the case of receiving RF signals, transport to the IC chip 312.

Figure 4A:
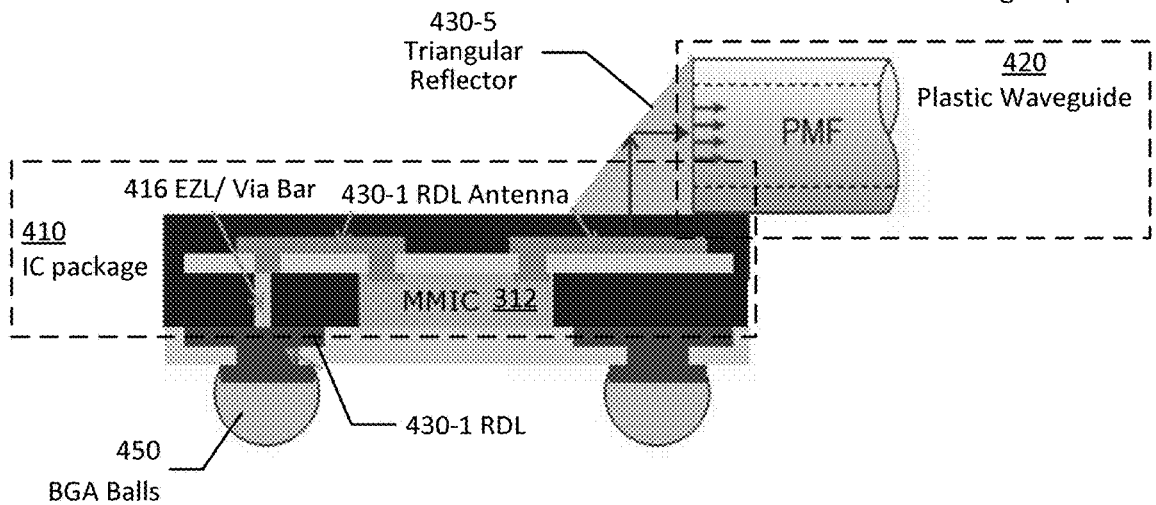
FIGS. 4A and 4B illustrate semiconductor devices having an IC package with longitudinal waveguide at package top, in accordance with aspects of the disclosure.

FIG. 4A illustrates a semiconductor device 400A having an IC package 410 with longitudinal plastic waveguide 420 at package top, in accordance with aspects of the disclosure.

Semiconductor device 400A comprises similar elements as semiconductor devices 100A, 100B, 200, and 300, but the reference numerals begin with "4". For the sake of brevity, descriptions of these elements are not repeated here.

The semiconductor chip 412 is embedded in a face-up configuration, so the RDL antenna 430-1 is formed on the top of the semiconductor chip 412 rather than on the bottom. RF signals are routed to the ball and board-side of the semiconductor chip 412 via an EZL/via bar 416, which is not part of the antenna, but is instead for realizing a vertical interconnection.

The plastic waveguide 420 in this example is configured to extend from a top the IC package 410 in a longitudinal direction on top of the RDL antenna 430-1. A triangular reflector 430-5 is configured to redirect RF signals from the RDL antenna 430-1 to the plastic waveguide 420, as indicated by the arrows, and in the opposite direction in the case of received RF signals. The triangular reflector 430-5 redirects RF signals so that the plastic waveguide 420 need not be formed vertically, but instead longitudinally. The triangular reflector 430-5 may comprise a dielectric with a metallized hypotenuse surface.

Figure 4B:
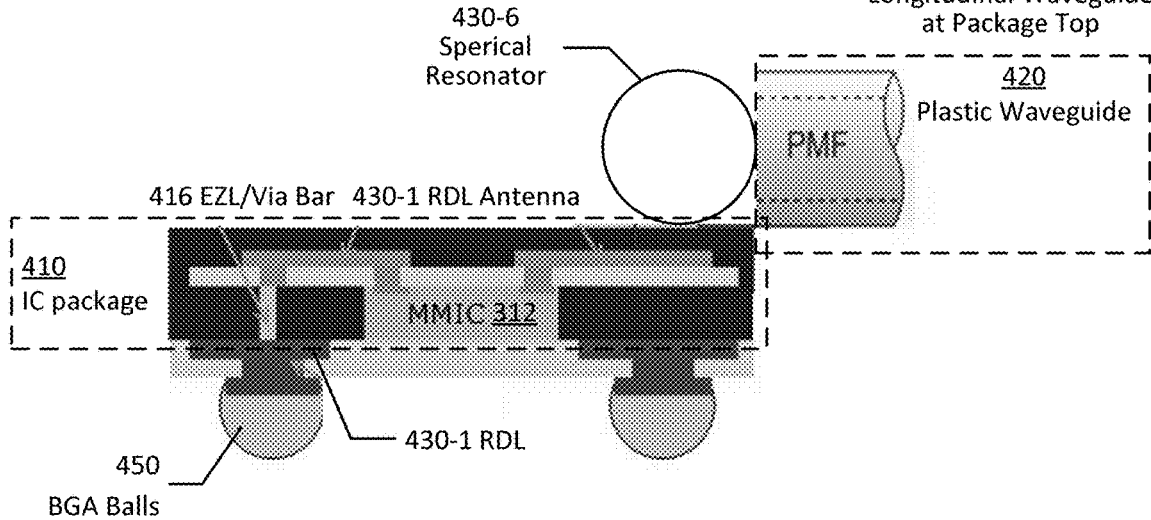

FIG. 4B illustrates a semiconductor device 400B having an IC package 410 with longitudinal waveguide 420 at package top, in accordance with aspects of the disclosure.

Semiconductor device 400B comprises similar elements as semiconductor device 400A. For the sake of brevity, descriptions of these elements are not repeated here.

The semiconductor device 400B of FIG. 4B is similar to the semiconductor device 400A of FIG. 4A, except that in place of the triangular reflector 430-5, there is a spherical resonator 430-6. The spherical resonator 430-6 does not have a metallized surface because the spherical resonator 430-6 functions to absorb energy rather than reflect the RF signal. The shape of the resonator concentrates energy, and since the plastic waveguide 420 touches the spherical resonator 430-6, the energy can be transported through the plastic waveguide 420, and in the opposite direction in the case of a received RF signal.

FIG. 5 illustrates a semiconductor device 500 having an IC package 510 with vertical waveguide 520 at package top, in accordance with aspects of the disclosure.

Semiconductor device 500 comprises similar elements as semiconductor devices 100A, 100B, 200, 300, 400A, and 400B, but the reference numerals begin with "5". For the sake of brevity, descriptions of these elements are not repeated here.

The RF signal is transported from the semiconductor chip 512 to the RDL antenna 530-1. To suppress signal losses, there may be reflectors (metallizations) 530-2 on the PCB/EZL to reflect RF signals, as indicated by the double-headed curved arrows.

The plastic waveguide 520 is attached to a top of the IC package 510 and configured to extend in a vertical direction. The plastic waveguide 520 may have a supporting structure (not shown) inside or outside of the IC package 510 to guide the plastic waveguide 520.

Figure 6A:
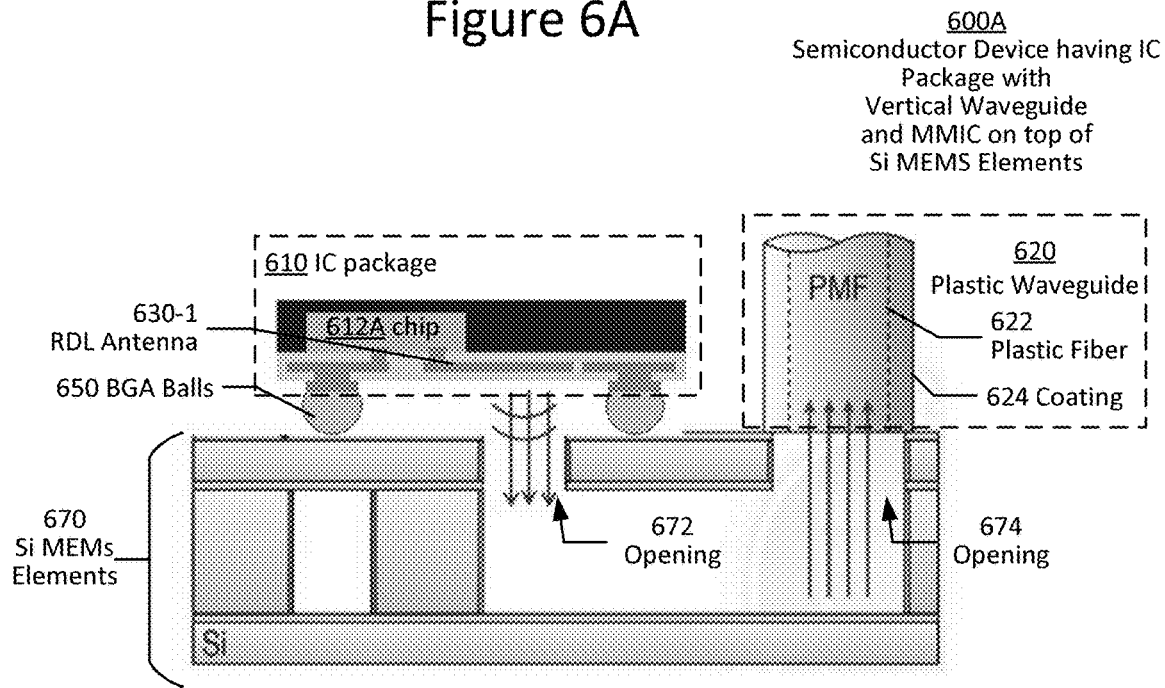
FIGS. 6A and 6B illustrate semiconductor devices having an IC package with vertical waveguide and with Monolithic Microwave Integrated Circuit (MMIC) on top of MEMS elements, in accordance with aspects of the disclosure.

FIG. 6A illustrates a semiconductor device 600A having an IC package 610 with vertical waveguide 620 and Monolithic Microwave Integrated Circuit (MMIC) 612A formed on top of MEMS elements 670, in accordance with aspects of the disclosure.

Semiconductor device 600A comprises similar elements as semiconductor devices 100A, 100B, 200, 300, 400A, 400B, and 500, but the reference numerals begin with "6". For the sake of brevity, descriptions of these elements are not repeated here.

The semiconductor device 600A comprises an IC package 610 with semiconductor chip 612A, Si-MEMS elements 670 external to the IC package 610, and a plastic waveguide 620. The IC package 610 comprises an RDL antenna 630-1 and is attached to the Si-MEMS elements 670 via BGA balls 650.

The Si-MEMS elements 670 is lined internally with planar metallizations, and may comprise elements such as tunable filters, tunable shifters, low loss couplers, etc. The Si-MEMS elements 670 also comprises two openings, a first opening 672 through which the RDL antenna 630-1 radiates, and a second opening 674 through which the plastic waveguide 620 radiates. The second opening 674 of the Si-MEMS elements 670 may have approximately a same diameter as the plastic waveguide 620.

The plastic waveguide 620 may have a supporting structure outside of the second opening 674 of the Si-MEMS elements 670 to guide the plastic waveguide 620. Optionally, the opening 672 of the Si MEMS elements 670 could be of the size of the plastic fiber 622, and the plastic waveguide 620 could project into the opening 674. For a case in which the plastic fiber 622 has an asymmetrical aspect ratio (e.g., rectangular), the shape of the opening 674 can also be used to encode a correct adaptation to the Si MEMS elements 670 to receive the intended polarization mode that preferably expands in the fiber 622.

The RF signal radiates from the RDL antenna 630-1 through the opening 672 as shown by the arrows, reflects within the Si MEMS elements 670 until the RF signal passes through the second opening 674 and transports through the plastic wave guide 620 as shown by the arrows. Of course in the case of receiving an RF signal, the RF signals transport in the opposite direction, that is, through the plastic waveguide 620, through the opening 674, within the Si MEMs elements 670, through the opening 672, and into the IC package 610.

The plastic waveguide 620 in this example is formed to project vertically from the top of the Si MEMS elements 670. Alternatively, the plastic waveguide 620 may be formed to project longitudinally from a side of the Si MEMS elements 670. An advantage of forming the plastic waveguide 620 on the top of the Si MEMS elements 670 is attachment with greater surface area is easier.

Figure 6B:
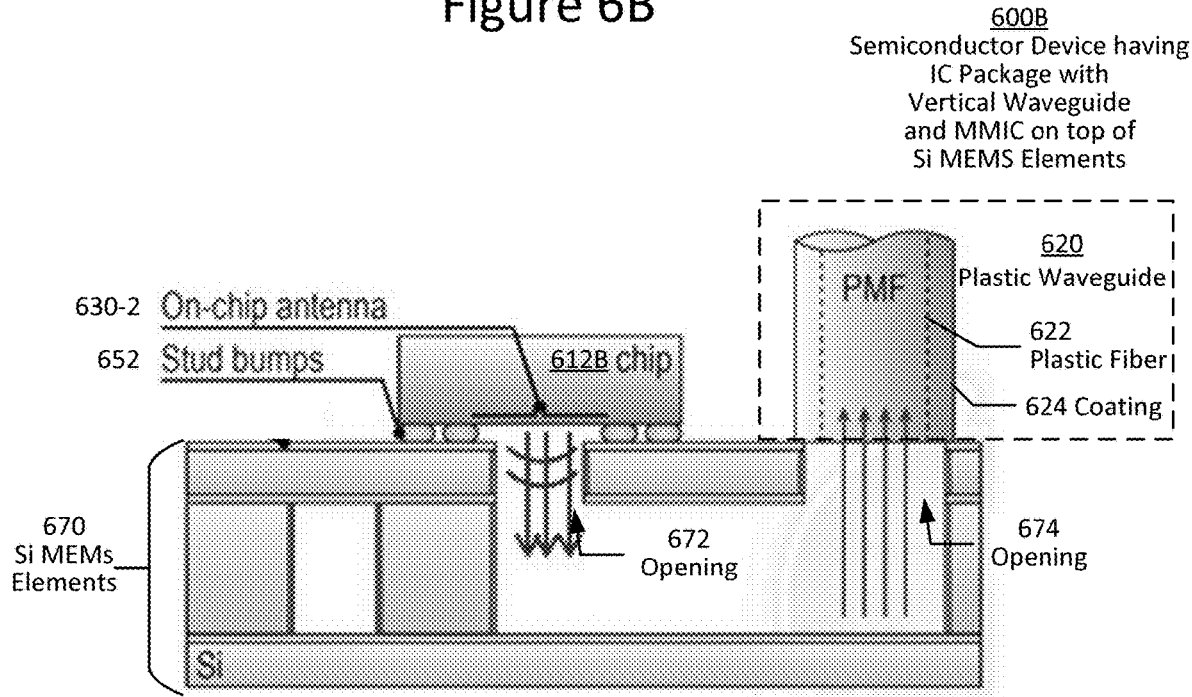

FIG. 6B illustrates a semiconductor device 600B having a semiconductor chip 612 and vertical waveguide 620 on top of MEMS elements 670, in accordance with aspects of the disclosure.

Semiconductor device 600B is similar to the semiconductor device 600A of FIG. 6A, except that rather than an IC package 610, semiconductor device 600B has a chip 612B formed using flip-chip technology. The chip 612B comprises an on-chip antenna 630-2 and is attached to the integrated MEMs elements 670 using stud bumps 652.

FIG. 7 illustrates a semiconductor device 700 having an IC package with vertical waveguide 720V at package top, and longitudinal waveguide 720L at package side, in accordance with aspects of the disclosure.

Semiconductor device 700 comprises similar elements as semiconductor devices 100A, 100B, 200, 300, 400A, 400B, 500, 600A, and 600B, but the reference numerals begin with "7". For the sake of brevity, descriptions of these elements are not repeated here.

The plastic waveguide 720 comprises both a longitudinal plastic waveguide 720L configured to extend in a longitudinal direction from a side of the IC package 710 and a vertical plastic waveguide 720V configured to extend in a vertical direction from a top of the IC package 710.

While specific examples for the semiconductor devices have been described herein, the disclosure is not limited to these examples. The disclosure covers semiconductor devices having any suitable combination of the describe features, for example, vertical versus longitudinal plastic waveguide, waveguide attached to top of IC package versus side or plastic waveguides attached to both top and side, triangular reflector versus spherical resonator, DWG versus PMF plastic waveguide, package versus flip-chip, plastic fiber at least partially embedded within the IC package or attached thereto, MEMS waveguide versus waveguide cage, MEMS elements formed separate from IC package, etc.

While the foregoing has been described in conjunction with exemplary aspects, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific aspects discussed herein.

What is claimed is:

1. A semiconductor device, comprising:
   an Integrated Circuit (IC) package, comprising:
      a semiconductor chip; and
      an embedded antenna formed within a Redistribution Layer (RDL) coupled to the semiconductor chip, wherein the RDL is configured to transport a Radio Frequency (RF) signal between the semiconductor chip and the embedded antenna; and a plastic waveguide attached to the IC package and configured to transport the RF signal between the embedded antenna and outside of the IC package, wherein the plastic waveguide is arranged at least partially within the IC package.

2. The semiconductor device of claim 1, wherein the plastic waveguide is configured to extend in a longitudinal direction.

3. The semiconductor device of claim 2, wherein longitudinal plastic waveguide is configured to extend from a side of the IC package.

4. The semiconductor device of claim 3, wherein the antenna is formed in a vertical direction.

5. The semiconductor device of claim 3, wherein the IC package further comprises an integrated Silicon Micro Electro Mechanical System (Si-MEMS) element.

6. The semiconductor device of claim 5, wherein the Si-MEMS element is a Si-MEMS waveguide.

7. The semiconductor device of claim 6, wherein the Si-MEMS waveguide is configured to project RF waves between the IC package and a center of the plastic waveguide.

8. The semiconductor device of claim 3, further comprising:
an embedded waveguide arranged between the embedded antenna and the plastic waveguide.

9. The semiconductor device of claim 8, wherein the embedded waveguide is an embedded waveguide cage comprising metallized vias.

10. The semiconductor device of claim 2,
wherein the plastic waveguide is configured to extend from a top the IC package, and
further comprising a reflector configured to redirect the RF signal from the embedded antenna to the plastic waveguide.

11. The semiconductor device of claim 1, wherein the plastic waveguide comprises a first longitudinal plastic waveguide configured to extend from a side of the IC package and a second vertical plastic waveguide configured to extend from a top of the IC package.

12. The semiconductor device of claim 1, wherein the plastic waveguide is configured to extend in a vertical direction.

13. The semiconductor device of claim 12, wherein the vertical plastic waveguide is configured to extend from a top of the IC package.

14. The semiconductor device of claim 12, further comprising:

a silicon Micro Electro Mechanical System (Si-MEMS) element,
wherein the IC chip is arranged on top of the Si-MEMS element.

15. The semiconductor device of claim 14, wherein an opening of the Si-MEMS element has approximately a same diameter as the plastic waveguide, and the plastic waveguide is arranged to be at least partially within the opening.

16. The semiconductor device of claim 1, wherein the plastic waveguide comprises a first plastic waveguide configured to extend in a longitudinal direction from a side of the IC package and a second plastic waveguide configured to extend in a vertical direction from a top of the IC package.

17. The semiconductor device of claim 1, further comprising:
an air gap arranged between the antenna and the plastic waveguide.

18. The semiconductor device of claim 1, wherein the plastic waveguide is attached to an outside of the IC package.

19. The semiconductor device of claim 1, wherein the plastic waveguide is a Dielectric Waveguide (DWG) or Polymer Microwave Fiber (PMF).

20. The semiconductor device of claim 1, wherein the IC package is a Wafer Level Package (WLP).

21. The semiconductor device of claim 1, wherein the semiconductor chip is Monolithic Microwave Integrated Circuit (MMIC) chip.

22. The semiconductor device of claim 1, wherein the semiconductor chip is arranged to be in a face-up orientation.

23. The semiconductor device of claim 1, wherein the semiconductor chip is arranged to be in a face-down orientation.

24. An Integrated Circuit (IC) package, comprising:
a semiconductor chip;
an embedded antenna formed within a Redistribution Layer (RDL) coupled to the semiconductor chip, wherein the RDL is configured to transport a Radio Frequency (RF) signal between the semiconductor chip and the embedded antenna; and
a plastic waveguide fastener,
wherein when a plastic waveguide is fastened to the IC package by the plastic waveguide fastener, the plastic waveguide is configured to transport the RF signal between the embedded antenna and outside of the IC package.

* * * * *